US011127619B2

(12) United States Patent
Ramaswamy et al.

(10) Patent No.: US 11,127,619 B2
(45) Date of Patent: Sep. 21, 2021

(54) WORKPIECE CARRIER FOR HIGH POWER WITH ENHANCED EDGE SEALING

(71) Applicant: APPLIED MATERIALS, INC., Santa Clara, CA (US)

(72) Inventors: Kartik Ramaswamy, San Jose, CA (US); Chunlei Zhang, Saratoga, CA (US); Haitao Wang, Sunnyvale, CA (US); Vijay D. Parkhe, San Jose, CA (US); Jaeyong Cho, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 239 days.

(21) Appl. No.: 15/364,973

(22) Filed: Nov. 30, 2016

(65) Prior Publication Data

US 2017/0352566 A1   Dec. 7, 2017

Related U.S. Application Data

(60) Provisional application No. 62/352,736, filed on Jun. 21, 2016, provisional application No. 62/346,849, filed on Jun. 7, 2016.

(51) Int. Cl.
*H01L 21/683* (2006.01)
*H01L 21/687* (2006.01)
*H01J 37/32* (2006.01)

(52) U.S. Cl.
CPC .... *H01L 21/6833* (2013.01); *H01J 37/32082* (2013.01); *H01J 37/32706* (2013.01); *H01J 37/32715* (2013.01); *H01L 21/68735* (2013.01); *H01J 2237/334* (2013.01)

(58) Field of Classification Search
None
See application file for complete search history.

(56) References Cited

U.S. PATENT DOCUMENTS

| 5,411,818 | A | * | 5/1995 | Barlow | H01M 50/183 |
| | | | | | 429/185 |
| 5,841,623 | A | * | 11/1998 | Denison | H01L 21/6831 |
| | | | | | 361/234 |
| 6,350,320 | B1 | * | 2/2002 | Sherstinsky | H01J 37/3244 |
| | | | | | 118/500 |
| 7,288,489 | B2 | | 10/2007 | Dolechek et al. | |

(Continued)

FOREIGN PATENT DOCUMENTS

| JP | 2001-297991 | 10/2001 |
| JP | 2005 033181 | 2/2005 |

(Continued)

OTHER PUBLICATIONS

International Search Report and Written Opinion from PCT/US2017/033590 dated Aug. 28, 2017, 14 pgs.

(Continued)

*Primary Examiner* — Charlee J. C. Bennett
(74) *Attorney, Agent, or Firm* — Schwabe, Williamson & Wyatt, P.C.

(57) ABSTRACT

A workpiece carrier suitable for high power processes is described. It may include a puck to carry the workpiece, a plate bonded to the puck by an adhesive, a mounting ring surrounding the puck and the cooling plate, and a gasket between the mounting ring and the plate, the gasket configured to protect the adhesive.

20 Claims, 3 Drawing Sheets

(56) References Cited

U.S. PATENT DOCUMENTS

| | | | |
|---|---|---|---|
| 10,153,138 B2* | 12/2018 | Aoto | H01J 37/32807 |
| 2004/0056429 A1* | 3/2004 | Okazaki | F16J 15/061 |
| | | | 277/627 |
| 2004/0065259 A1 | 4/2004 | Inazumachi et al. | |
| 2004/0157120 A1* | 8/2004 | Wu | H01M 6/085 |
| | | | 429/174 |
| 2005/0042881 A1 | 2/2005 | Nishimoto et al. | |
| 2005/0103275 A1* | 5/2005 | Sasaki | H01J 37/32706 |
| | | | 118/728 |
| 2006/0283552 A1* | 12/2006 | Rogers | H01L 21/3065 |
| | | | 156/345.33 |
| 2007/0065678 A1* | 3/2007 | Ko | H01L 21/6833 |
| | | | 428/698 |
| 2007/0131350 A1* | 6/2007 | Ricci | H01L 21/68785 |
| | | | 156/293 |
| 2007/0137117 A1* | 6/2007 | Carlson | B64C 1/1492 |
| | | | 52/204.1 |
| 2007/0144442 A1* | 6/2007 | Migita | C23C 16/4586 |
| | | | 118/728 |
| 2009/0002913 A1* | 1/2009 | Naim | H01L 21/67109 |
| | | | 361/234 |
| 2015/0187614 A1 | 7/2015 | Gaff et al. | |
| 2015/0279714 A1 | 10/2015 | Yamaguchi et al. | |
| 2016/0111314 A1 | 4/2016 | Kimball et al. | |
| 2016/0111315 A1 | 4/2016 | Parkhe | |
| 2016/0148828 A1 | 5/2016 | Parkhe | |
| 2017/0047238 A1 | 2/2017 | Lee | |
| 2017/0338140 A1* | 11/2017 | Pape | H01L 21/68735 |

FOREIGN PATENT DOCUMENTS

| | | |
|---|---|---|
| JP | 2007-194616 | 8/2007 |
| JP | 2012-500498 | 1/2012 |
| JP | 2013-511847 | 4/2013 |
| JP | 2015-501538 | 1/2015 |
| TW | 2007/10935 | 3/2007 |
| TW | 2013/34635 | 8/2013 |

OTHER PUBLICATIONS

Decision of Rejection from Japanese Patent Application No. 2018-563550 dated Apr. 22, 2020, 7 pgs.

Notice of Reasons for Rejection from Japanese Patent Application No. 2018-563550 (Etch-Dielectric/Reactive Ion Etch/MDD), dated Dec. 25, 2019, 5 pgs.

Notice of Preliminary Rejection from Korean Patent Application No. 10-2019-7000343 (Etch/Etch_DRIE/DBURNS), dated Mar. 12, 2020, 9 pgs.

Notice of Final Preliminary Rejection from Korean Patent Application No. 10-2019-7000343 dated Oct. 28, 2020, 9 pgs.

Official Letter from Taiwan Patent Application No. 106118638 dated Dec. 11, 2020, 12 pages.

International Preliminary Report on Patentability from international Patent Application No. PCT/US2017/033590 dated Dec. 20, 2018, 10 pgs.

Notice of Final Rejection and Notice of Decision to Dismiss an Amendment from Korean Patent Application No. 10-2019-7000343 dated Apr. 16, 2021, 6 pgs.

\* cited by examiner

WORKPIECE CARRIER FOR HIGH POWER WITH ENHANCED EDGE SEALING

CROSS-REFERENCE TO RELATED APPLICATIONS

The present application claims priority to prior U.S. Provisional Application Ser. No. 62/352,736 filed Jun. 21, 2016, entitled HIGH POWER ESC DESIGN WITH ENHANCED EDGE SEALING by Kartik Ramaswamy, et al., the priority of which is hereby claimed and U.S. Provisional Application Ser. No. 62/346,849 filed Jun. 7, 2016, entitled HIGH POWER ESC DESIGN WITH ENHANCED EDGE SEALING by Kartik Ramaswamy, et al., the priority of which is hereby claimed.

FIELD

The present description relates to the field of silicon and micromechanical processing and, in particular, to sealing and bonding in a workpiece carrier.

BACKGROUND

In the manufacture of semiconductor chips, a silicon wafer or other substrate is exposed to a variety of different processes in different processing chambers. The chambers may expose the wafer to a number of different chemical and physical processes whereby minute integrated circuits are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

In these manufacturing processes, plasma may be used for depositing or etching various material layers. Plasma processing offers many advantages over thermal processing. For example, plasma enhanced chemical vapor deposition (PECVD) allows deposition processes to be performed at lower temperatures and at higher deposition rates than in analogous thermal processes. PECVD therefore allows material to be deposited at lower temperatures.

The processing chambers used in these processes typically include a substrate support, pedestal, or chuck disposed therein to support the substrate during processing. In some processes, the pedestal may include an embedded heater adapted to control the temperature of the substrate and/or provide elevated temperatures that may be used in the process.

HAR (High Aspect Ratio) plasma etch uses a significantly higher bias power to achieve bending free profiles. In order to support HAR for dielectric etching, the power may be increased to 20 KW, which brings significant impacts on an ESC (Electrostatic Chuck). Many current ESC designs cannot survive such a high voltage which comes as a direct result of a high bias power. Holes designed into an ESC may suffer in particular. Moreover, an ESC may experience bond failures in the lift pin area when excess radicals erode the bonds. Another impact is that the ESC surface temperature changes at a higher rate. The heating of the ESC surface is directly proportional to the applied RF plasma power. The heat may also be a result of bond failure.

Common processes use an ESC to hold a wafer with 2 MHz 6.5 KW plasma power applied to the wafer for etching applications. High aspect ratio (e.g. 100:1) applications use much higher plasma powers. An ESC is described herein that operates with a low frequency high power plasma voltage to generate a high wafer bias. The higher power will increase failures of the ESC due to the dielectric breaking down and due to plasma ignition in various holes and openings that are designed into the ESC.

SUMMARY

A workpiece carrier suitable for high power processes is described. It may include a puck to carry the workpiece, a plate bonded to the puck by an adhesive, a mounting ring surrounding the puck and the cooling plate, and a gasket between the mounting ring and the plate, the gasket configured to protect the adhesive.

BRIEF DESCRIPTION OF THE DRAWINGS

Embodiments of the present invention are illustrated by way of example, and not limitation, in the figures of the accompanying drawings in which.

DETAILED DESCRIPTION

The described ESC withstands high power and high bias voltages. The described inventive ESC has several novel features including a side wall bonding layer protection O-ring or metal gasket to protect the bonding layer. In some embodiments, the O-ring has a rectangular or square shape which fills out more than 90% of the pocket in the ESC and a compression of about 12%. This O-ring reduces the gas discharge possibility around the O-ring. It also prevents corrosion of the bond between a ceramic top plate and an aluminum base plate, and changes the electric field near the edge of the ESC.

Figure 1:
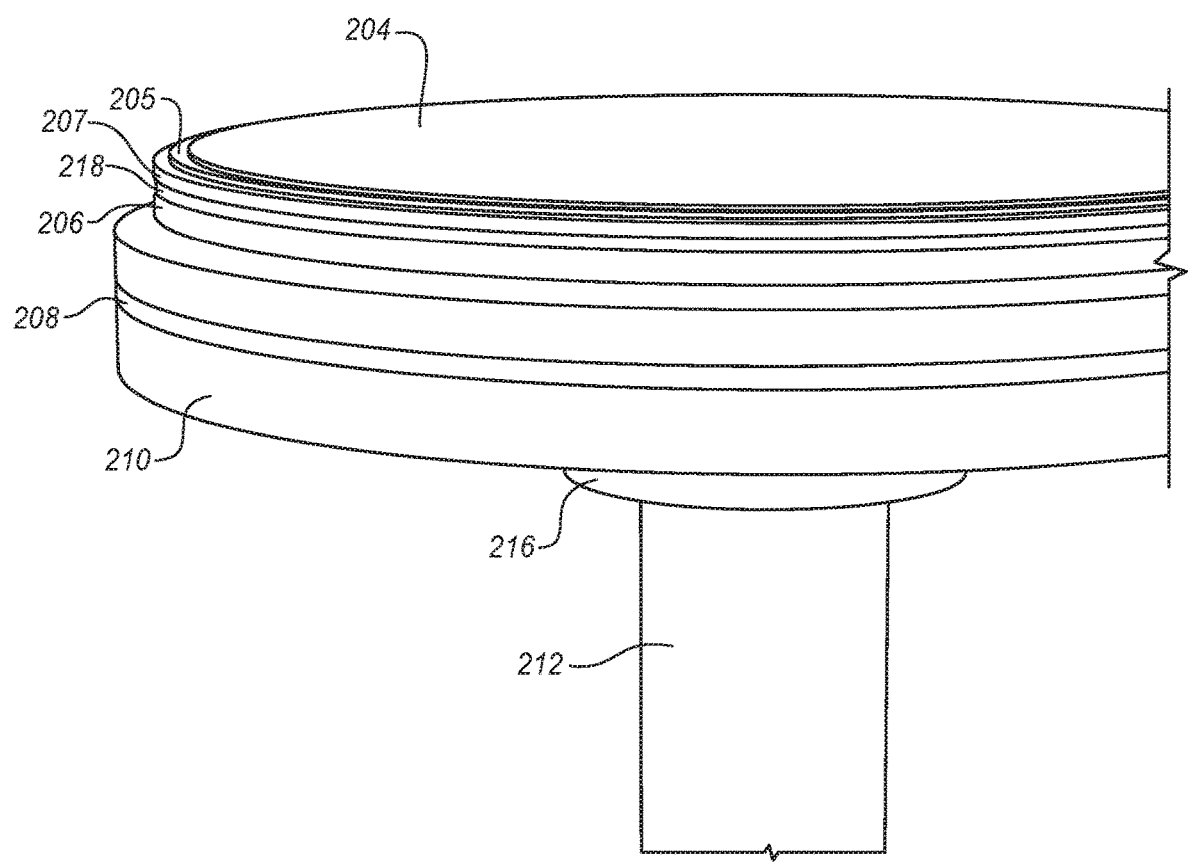
FIG. 1 is an isometric view of an assembled electrostatic chuck in accordance with an embodiment of the invention.

FIG. 1 is an isometric view of an assembled electrostatic chuck. A support shaft 212 supports a base plate 210 through an isolator 216. A middle isolator plate 208 and an upper cooling plate 206 are carried by the base plate. The top cooling plate 206 carries a dielectric puck 205 on the top surface of the heater plate. The puck has an upper circular platform to support a workpiece 204 and a lower concentric circular base 207 to attach to the heater plate. The upper platform has internal electrodes to electrostatically attach the workpiece. The workpiece may alternately be clamped, vacuumed or attached in another way. There is a gasket seat 218 between the puck 205 and the top cooling plate 206. A gasket held in place by this gasket seat forms a seal against mounting rings as shown in FIG. 2.

The ESC is able to control the temperature of the workpiece using resistive heaters in the puck or cooling plate or coolant fluid in the cooling plate or both. Electrical power, coolant, gases, etc. are supplied to the coolant plate 206 and the puck 205 through the support shaft. The ESC may also be manipulated and held in place using the support shaft.

Figure 2:
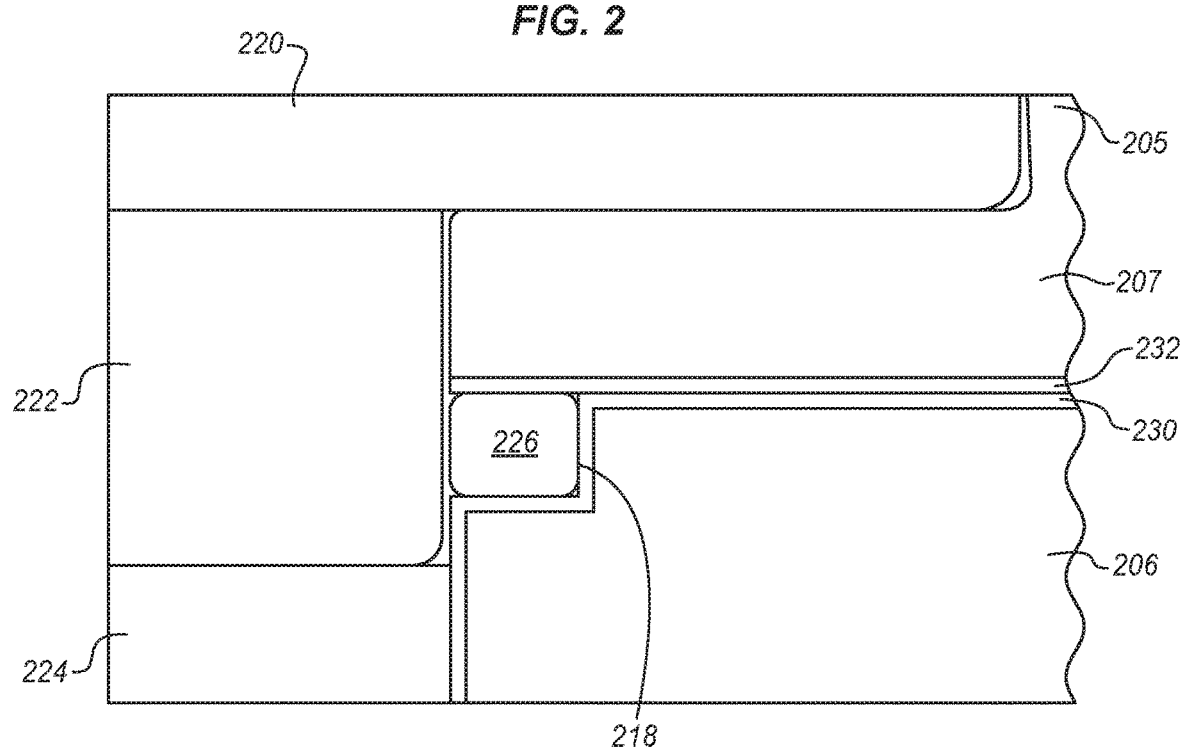
FIG. 2 is a cross-sectional side view diagram of a portion of the chuck of FIG. 1 showing mounting rings in accordance with an embodiment of the invention.

FIG. 2 is a cross-sectional side view diagram of a portion of the ESC of FIG. 1 showing mounting rings that carry and hold the ESC when in use. The cooling plate 206 has a dielectric coating 230. Any of a variety of different dielectrics, including alumina may be used. The lower larger part of the puck 207 is attached to the base plate using an adhesive 232. The puck may be fabricated from a ceramic, such as alumina or aluminum nitride and the adhesive is selected to provide a secure bond between the metal cooling plate and the ceramic as well as to withstand the environment within a plasma processing chamber. A silicon ring 220 encircles the outer edge of the puck 205 and provides a ledge to hold a workpiece (not shown) in place over the puck.

The cooling plate or Al base 206 and the puck 207 are encircled by two mounting rings 222, 224. The mounting rings may be made of any rigid material that is suitable for withstanding the plasma process chamber. In some embodiments, the mounting rings are quartz. The mounting rings are sealed against the Al base and the puck by an O-ring 226 that is held in the gasket seat 218 also shown in FIG. 1.

In order to protect the bonding layer 232 in between the ceramic plate and the cooling plate from plasma, the O-ring fills the gasket seat. The O-ring may be formed of metal or an elastomeric material such as perfluorelastomers, polyfluorotetraethylene, etc. In the lower diagram a square or rectangular shaped cross-section for the O-ring does not leave a big enough space for plasma light-up in the spaces in the O-ring channel. In some embodiments, there may be a compression of about 12% with a fill rate in the O-ring channel of about 90%.

When the shape and mechanical tolerance of the O-ring and channel leaves too much space, then the electrical impedance is lower in the space around the O-ring than in other areas. This causes RF power coupling from an RF plasma into the space. Plasma light-up and arcing occur. Charge may also collect. If gases are allowed to slip through the gaps between the Al base and the quartz rings, then there may be residue that is burnt on to these inner surfaces in addition to the arcing caused by the collected charge.

A ceramic puck have a dielectric constant of about 9, while the aluminum cooling plate is a very good electrical conductor and has a much higher dielectric constant. Similarly, ceramic has a much lower coefficient of thermal expansion than aluminum. The combination of the dielectric puck 207 with the conductive cooling plate 206 means first that when a high power RF plasma is applied current will be generated in the cooling plate and then collect as charge around the ceramic. If there are air gaps around the ceramic, then more charge will accumulate. Air has a dielectric constant of 1 so that it acts as a better charge collector than the ceramic. It also means that when the ESC is cycled through extreme heat changes the adhesive bond 232 will be stressed as the aluminum expands and contracts more than the ceramic puck.

Using the gasket 226, the configuration of FIG. 2 provides a seal against reaction gases and molecules accumulating around the puck and reaching the adhesive. These gases cannot then destroy the adhesive bond. The gasket also fills in gaps where charge might collect and produce arcing. Using a metal gasket or partially conductive gasket, the gasket is able to conduct accumulated charge away from the gasket and between the ceramic and the aluminum. A conductive gasket, such as a metal provides an Ohmic contact between the ceramic and the metal to conduct any accumulated charge back into the top plate and the puck. In some embodiments, the conductive gasket has a dielectric constant similar to that of the puck or about 9. This allows for current flow through the gasket into the puck and discourages current flow through the gasket.

A conductive gasket may be fabricated from a suitable elastomeric material filled with aluminum particles or with a metal band, or in any of a variety of other ways. A metal gasket may be fabricated using metal such as aluminum, molybdenum, tungsten, stainless steel, and nickel. The gaskets may alternatively be made from other non-metal materials such as carbon or filled elastomers. Some of these metals are vulnerable in the chamber and may be protected from chemical attacks using strategically placed O rings.

As mentioned above, FIG. 2 also shows an optional coating 230 on the Al base 206. This coating is between the Al base and the quartz rings 222, 224 and is also between the Al base and the puck 207. A coating of yttria or alumina on the entire sidewall of the ESC covers the bare Al and prevents corrosion.

This provides significant benefits over a design that has an anodized plate on the side wall of the ESC to protect the Al base and its metal contamination from corrosive process gases such as fluorine and chlorine. An anodized base is compromised with time and bare Al is then exposed to the process gases. This causes metal contamination issues or electrical arcing events.

Figure 3:
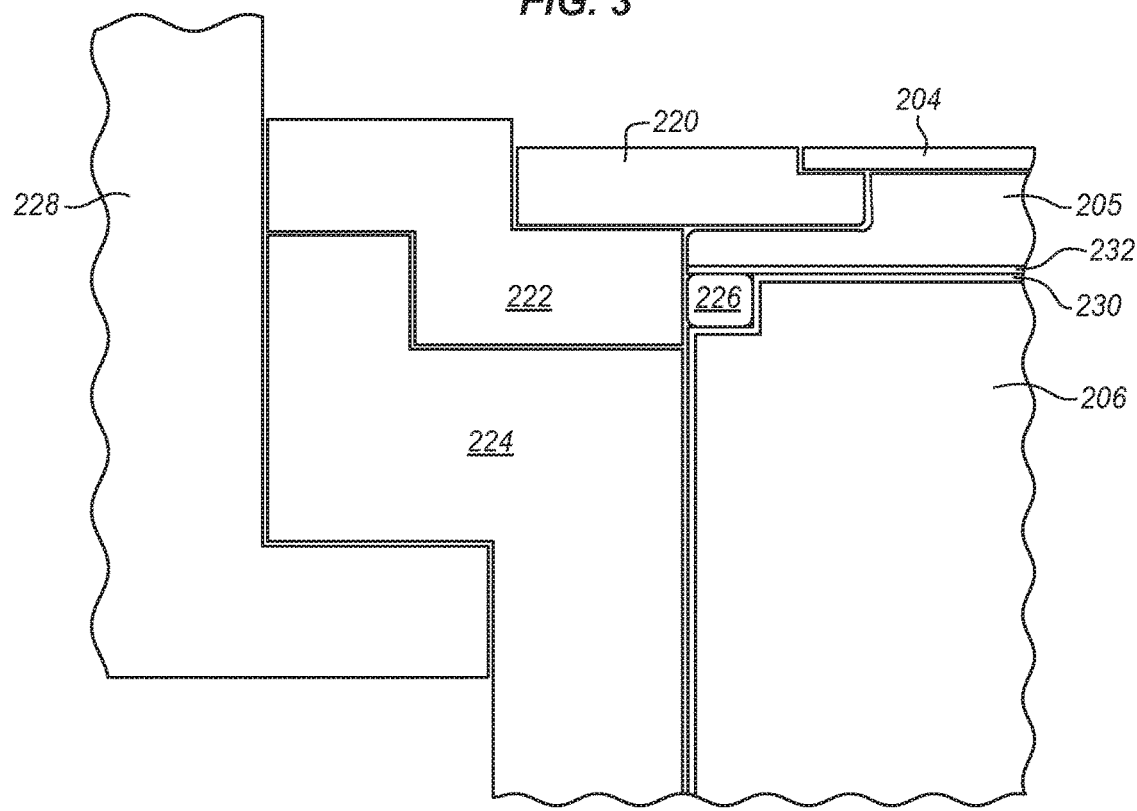
FIG. 3 is a cross-sectional side view diagram of a portion of the chuck of FIG. 1 with mounting plates and a workpiece in accordance with an embodiment of the invention.

FIG. 3 is a cross-sectional side view diagram of a portion of the ESC with mounting plates and a workpiece. It is similar to that of FIG. 2 but showing more of the component pieces and with the workpiece. The base cooling plate 206 is supported by a dielectric plate and base support plate (not shown). The dielectric puck 205 is attached to the cooling plate by an adhesive. Quartz mounting rings 222, 224 surround and carry the cooling plate and the puck. These rings encircle the cooling plate and puck. The particular configuration is provided as an example and any of a variety of different mounting ring configurations may be used. The cooling plate is sealed against the quartz rings by the gasket 226. A baffle 228 surrounds the mounting rings as is known in the art.

The silicon ring 220 is attached over the puck 205 and the upper quartz ring 222. The silicon ring comes to the edge of the puck and provides a ledge to carry the workpiece 204. The silicon ring surrounds the outer periphery of the workpiece and also supports the outer edge of the workpiece. The puck supports the rest of the workpiece within the outer edge. The workpiece may be a silicon wafer or any other suitable material or component for plasma processing.

Gas may be delivered to the back side of the wafer between the top surface of the pedestal and the wafer to improve heat convection between the wafer and the pedestal. An effective radial gas flow improves gas flow across the back side of the wafer. The gas may be pumped through a channel in the base of the pedestal assembly to the top of the pedestal. A mass flow controller may be used to control the flow through the pedestal. In a vacuum or chemical deposition chamber, the backside gas provides a medium for heat transfer for heating and cooling of the wafer during processing. Gas flow may be improved by establishing a radial flow pattern from the center of the wafer in stepped pockets in the heater pedestal design.

Figure 4:
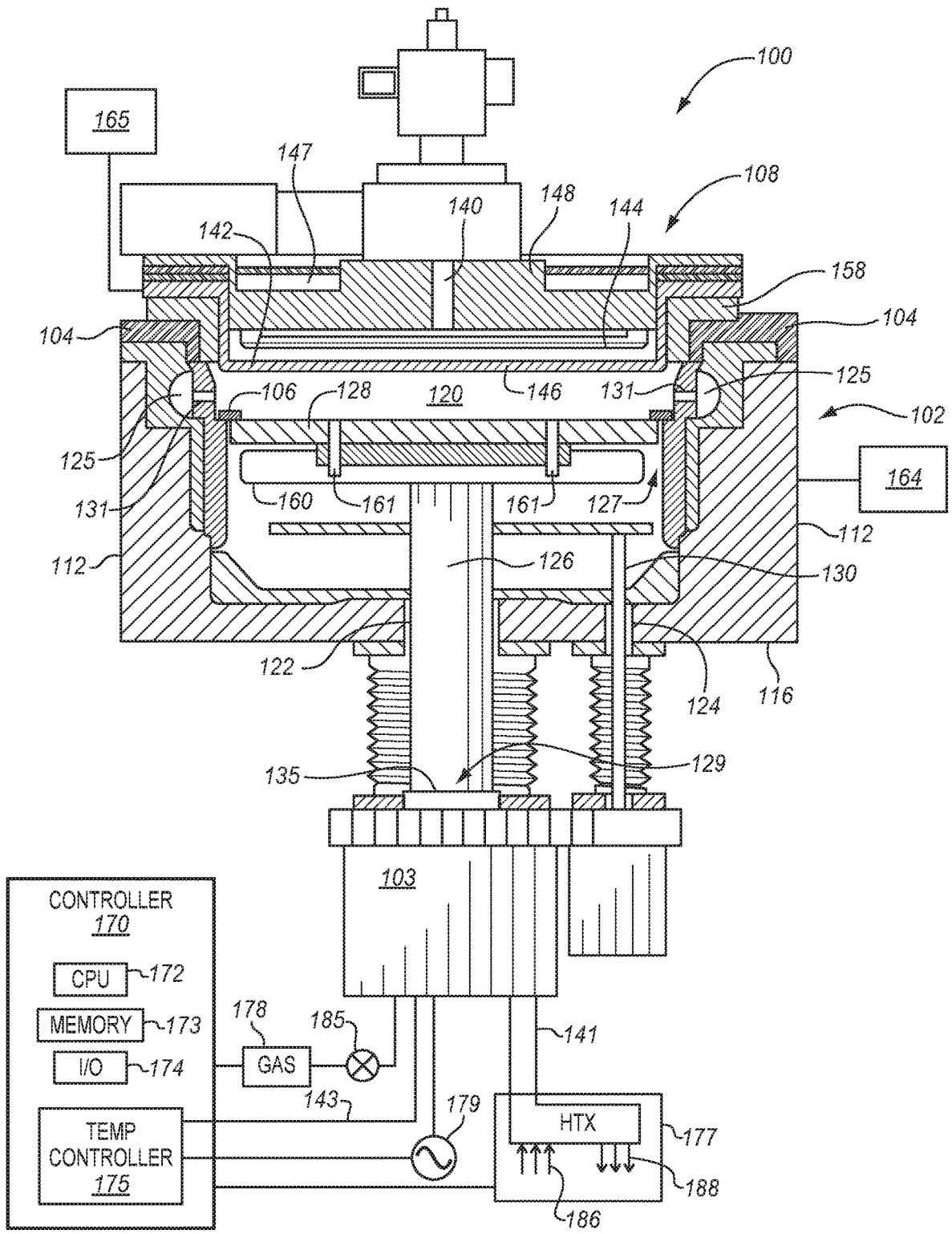
FIG. 4 is a diagram of a plasma etch system including a workpiece carrier in accordance with an embodiment of the present invention.

FIG. 4 is a partial cross sectional view of a plasma system 100 having a pedestal 128 according to embodiments described herein. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 100 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 112 of the chamber body 102 to prevent exposure of the sidewalls 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 128 and a heat source and/or heat sink external to the plasma chamber 105, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 128 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 128 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) may also be used in the ESC to apply heat to the workpiece assembly. The electric heaters, typically in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the chuck assembly 128 through a mass flow meter 185 or other type of valve. The backside gas may be helium, argon, or any gas that provides heat convection between the wafer and the puck without affecting the processes of the chamber. The gas source pumps gas through a gas outlet of the pedestal assembly described in more detail below to the back side of the wafer under the control of the system controller 170 to which the system is connected.

The processing system 100 may also include other systems, not specifically shown in FIG. 4, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause and effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

Examples of different embodiments of an ESC design include a side wall bonding layer protection to prevent arcing.

Embodiments include the design above in which there is a cooling plate or Al base and a puck that are encircled by one or more, for example two rings, made for example of quartz, and optionally a silicon ring that encircles the outer edge of the puck, wherein the quartz rings are sealed against the Al base and the puck by an O-ring.

Embodiments include the design above in which the O-ring contacts the puck, the base and a ring.

Embodiments include the design above in which the O-ring has a square or rectangular shaped cross-section.

Embodiments include the design above in which the O-ring does not leave a big enough space for plasma light-up in the spaces in the O-ring channel.

Embodiment include the design above in which there is a compression of about 12% or in which there is a fill rate in the O-ring channel of about 90%.

Embodiments include the design above in which the O-ring is fabricated from a perfluoroelastomer.

Embodiment includes the design above in which the O-ring has a dielectric constant greater than 9.

Embodiments include the design above in which the puck has a dielectric constant of about 9 and is made for example of a ceramic such as alumina or silicon nitride.

Embodiments include the design above in which the O-ring is metal.

Embodiments include the design above in which the O-ring is electrically conductive to conduct charge away from the space between the base and the ring.

Embodiment include means for performing any of the functions described above.

What is claimed is:

1. A workpiece carrier comprising:
   a puck to carry a workpiece;
   a cooling plate bonded to the puck by an adhesive, the cooling plate having a dielectric coating, the dielectric coating having an uppermost surface;
   a mounting ring surrounding the puck and the cooling plate; and
   a gasket positioned laterally between the mounting ring and the dielectric coating of the cooling plate, the gasket configured to protect the adhesive, wherein a first portion of the adhesive is vertically over the gasket and a second portion of the adhesive extends beyond the gasket and is vertically over the cooling plate, the first portion of the adhesive continuous with the second portion of the adhesive, and wherein the gasket has an uppermost surface co-planar with the uppermost surface of the dielectric coating of the cooling plate.

2. The carrier of claim 1, wherein the gasket is to prevent arcing between the puck and the cooling plate.

3. The carrier of claim 1, wherein the mounting ring comprises one or more rings encircling the cooling plate and the puck wherein the rings are sealed against the cooling plate and the puck by the gasket.

4. The carrier of claim 1, wherein the gasket contacts the puck, the dielectric coating of the cooling plate and the ring.

5. The carrier of claim 1, wherein the gasket has a rectangular cross-section.

6. The carrier of claim 1, wherein the gasket is configured to fill a gasket channel sufficient to prevent plasma lightup in the gasket channel.

7. The carrier of claim 6, wherein the gasket has a fill rate in the gasket channel of about 90%.

8. The carrier of claim 1, wherein the gasket has a compression of about 12%.

9. The carrier of claim 1, wherein the gasket is fabricated from a perfluoroelastomer.

10. The carrier of claim 1, wherein the gasket has a dielectric constant about the same as a dielectric constant of the puck.

11. The carrier of claim 10, wherein the puck has a dielectric constant of about 9 and is made of a ceramic.

12. The carrier of claim 1, wherein the gasket is metal.

13. The carrier of claim 1, wherein the gasket is electrically conductive and configured to conduct charge away from the space between the cooling plate and the ring.

14. The carrier of claim 1, wherein the ring is made of quartz, the carrier further comprising a silicon ring that encircles an outer edge of the puck.

15. An electrostatic chuck (ESC) to carry a silicon wafer, the ESC comprising:
 a ceramic puck to carry the wafer;
 an electrostatic conductive electrode in the puck to electrostatically hold the wafer;
 an aluminum cooling plate bonded to the puck by an adhesive to cool the wafer, the aluminum cooling plate having a dielectric coating, the dielectric coating having an uppermost surface;
 a quartz mounting ring surrounding the puck and the cooling plate;
 a gasket channel positioned laterally between the mounting ring and the dielectric coating of the aluminum cooling plate; and
 a gasket within the gasket channel configured to reduce arcing in the gasket channel, wherein a first portion of the adhesive is vertically over the gasket and a second portion of the adhesive extends beyond the gasket and is vertically over the cooling plate, the first portion of the adhesive continuous with the second portion of the adhesive, and wherein the gasket has an uppermost surface co-planar with the uppermost surface of the dielectric coating of the aluminum cooling plate.

16. The ESC of claim 15, wherein the gasket is electrically conductive and configured to conduct charge away from the gasket channel and the cooling plate.

17. The ESC of claim 15, wherein the gasket fills the gasket channel with a fill rate of about 90%.

18. A plasma processing chamber comprising: a plasma chamber;
 a plasma source to generate a plasma containing gas ions in the plasma chamber; and
 a workpiece carrier to carry a workpiece for processing within the chamber, the carrier having a puck to carry the workpiece, a cooling plate bonded to the puck by an adhesive, the cooling plate having a dielectric coating, the dielectric coating having an uppermost surface, a mounting ring surrounding the puck and the cooling plate, and a gasket positioned laterally between the mounting ring and the dielectric coating of the cooling plate, the gasket configured to protect the adhesive from the plasma, wherein a first portion of the adhesive is vertically over the gasket and a second portion of the adhesive extends beyond the gasket and is vertically over the cooling plate, the first portion of the adhesive continuous with the second portion of the adhesive, and wherein the gasket has an uppermost surface co-planar with the uppermost surface of the dielectric coating of the cooling plate.

19. The chamber of claim 18, wherein the puck has a dielectric constant of about 9 and the gasket has a dielectric constant about the same as a dielectric constant of the puck.

20. The chamber of claim 18, wherein the gasket has a compression of about 12%.

* * * * *